United States Patent [19]

Miles et al.

[11] Patent Number: 5,696,666
[45] Date of Patent: Dec. 9, 1997

[54] LOW PROFILE EXPOSED DIE CHIP CARRIER PACKAGE

[75] Inventors: Barry M. Miles, Plantation; Glenn E. Gold, Lauderhill, both of Fla.

[73] Assignee: Motorola, Inc., Schaumburg, Ill.

[21] Appl. No.: 540,995

[22] Filed: Oct. 11, 1995

[51] Int. Cl.$^6$ .................................................. H05K 1/18
[52] U.S. Cl. ........................ 361/764; 361/761; 257/684
[58] Field of Search .................................. 361/761, 764, 361/772, 774, 779, 765; 257/678, 684, 697, 723, 724, 737, 778; 228/180.21, 180.22; 437/209, 211

[56] References Cited

U.S. PATENT DOCUMENTS

| | | | |
|---|---|---|---|
| 4,598,337 | 7/1986 | Wuthrich et al. | 361/763 |
| 4,688,152 | 8/1987 | Chia | 361/776 |
| 4,866,506 | 9/1989 | Nambu et al. | 257/667 |
| 5,130,889 | 7/1992 | Hamburgen et al. | 361/761 |
| 5,239,198 | 8/1993 | Lin et al. | 257/693 |
| 5,241,133 | 8/1993 | Mullen, III et al. | 174/52.4 |
| 5,262,351 | 11/1993 | Bureau et al. | 437/215 |
| 5,287,247 | 2/1994 | Smits et al. | 361/761 |
| 5,296,738 | 3/1994 | Freyman et al. | 257/684 |
| 5,309,322 | 5/1994 | Wagner et al. | 361/761 |
| 5,384,689 | 1/1995 | Shen | 361/761 |
| 5,506,383 | 4/1996 | Chen | 437/209 |
| 5,541,450 | 7/1996 | Jones et al. | 257/697 |
| 5,631,807 | 5/1997 | Griffin | 361/764 |

FOREIGN PATENT DOCUMENTS 0 516 170 A2  12/1992  European Pat. Off. ........... 361/765

OTHER PUBLICATIONS

Conference Publication 44th Electronic Components & Technology Conference, May 1 – May 4, 1994, Washington, D.C. 1994 Proceedings, pp. 67–74, IEEE.

*Primary Examiner*—Leo P. Picard
*Assistant Examiner*—John B. Vigushin
*Attorney, Agent, or Firm*—Dale W. Dorinski; Glenn E. Gold

[57] ABSTRACT

An integrated circuit package (10) comprises a semiconductor die (12), and a substrate (14) having a through-cavity opening (22) for receiving the semiconductor die. The bottom side of the substrate has solder pads (24) arranged as a peripheral pad grid array. The semiconductor die is wire bonded (26) to the to the top side of the substrate. An encapsulant (16) seals the top surface of the semiconductor die and circuitry, and portions of the top side of the substrate. The bottom surface of the semiconductor die remains exposed to the atmosphere, eliminating moisture-related die attach delamination issues and improving heat transfer away from the semiconductor die. Furthermore, the reduced contribution of the semiconductor die to overall package height results in an ultra low profile package.

15 Claims, 2 Drawing Sheets

LOW PROFILE EXPOSED DIE CHIP CARRIER PACKAGE

TECHNICAL FIELD

This invention relates to printed circuit board chip carriers, and more particularly to overmolded and glob top chip carriers that provide for moisture relief.

BACKGROUND OF THE INVENTION

Plastic Ball Grid Array (PBGA) chip carriers, such as the Over Molded Pad Array Carrier (OMPAC™), the Over Molded Peripheral Chip Carrier (OMPCC), and the Over Molded Pin Grid Array (OMPGA) and their equivalent glob top printed circuit board (PCB) chip carriers are susceptible to moisture absorption. When subjected to heat, these integrated circuit packages suffer from a well-known phenomenon called "popcorning." This problem is particularly noticeable in surface mount packages using PCB substrates; they experience thermal and mechanical stresses due to exposure of the entire package to solder reflow temperatures. Typically, PCB packages must be baked prior to solder assembly to remove moisture. Moisture usually penetrates into and through the molded plastic resin encapsulant, the PCB substrate, and especially the adhesive used to attach the die to the substrate. The die attach adhesive is usually a hygroscopic material. When the package is exposed to solder reflow temperatures after the die attach adhesive has absorbed moisture, the moisture is rapidly converted into a gas, expanding dramatically. This causes the die to delaminate from the substrate, creating the "popcorn" effect.

U.S. Pat. No. 4,866,506 by Nambu et. al. discusses a flat plastic-sealed lead frame package that has an opening on an underside of the package, allowing the die flag to be exposed to the atmosphere, thereby venting or releasing moisture when subjected to heat. This package, also known as the Quad Flat Pack (QFP), is easily manufactured, but leaves the bottom surface of the lead frame exposed to the atmosphere. The QFP does not use a substrate or PCB as in OMPAC, OMPCC, and OMPGA and their equivalents; thus, a different solution is required.

U.S. Pat. No. 5,296,738 by Freyman et. al. discusses a PCB chip carrier with an opening(s) in the PCB substrate, located directly beneath the semiconductor die, which provides the means for moisture relief when the package is subjected to extreme temperature excursions (e.g., board reflow profiles). In this package, the opening is initially covered on the back side of the PCB substrate with solder resist. The covered opening prevents the flow of die attach material from the top side surface, through the opening, on to the back side solder pads; however, the opening(s) are partially or completely filled with die attach material. After final assembly of the package, the solder resist must be pierced or punctured to create the final opening for moisture relief.

DESCRIPTION OF THE PREFERRED EMBODIMENT

An integrated circuit (IC) package has a semiconductor die mounted in a printed circuit substrate. The substrate has a through-cavity opening with a perimeter which is substantially the same shape and size as the die perimeter. Here, the term "through-cavity opening" describes a rectangular-shaped opening in the center of the substrate which extends completely through the substrate. The die is seated in the through-cavity opening such that the bottom surface of the die is substantially coplanar with the bottom side of the substrate. The typical die-to-substrate die attach interface is eliminated, leaving the back surface of the die exposed to the atmosphere. Die attach material is no longer needed, since it is not necessary to mount the die on to a substrate. Thus, the package is less susceptible to the effects of moisture absorption, as the hygroscopic die attach material is eliminated. As an added benefit of having the back surface of the die exposed to the atmosphere, heat generated by the die, which must typically be drawn from the chip through package interconnects and added heat sinks, is more directly and efficiently dissipated. An overmolded or glob top material encapsulates the top surface of the die and portions of the substrate top side. The die is held in place by direct and intimate contact between the through-cavity opening perimeter and the die perimeter, and encapsulant-to-die adhesion. In calculating the overall height profile of the package, the thickness of the chip can be virtually eliminated as a factor, since the top surface of the die is at approximately the same level as the top side of the substrate. Lower wire bond loop heights also contribute to reduction in package height profile, due to the lower level of the die. Therefore, an additional benefit of the present invention is that it results in a significantly reduced package profile.

Figure 1:
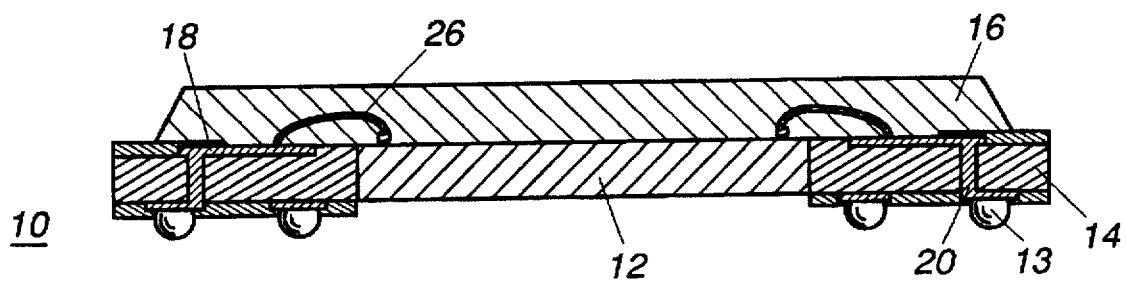
FIG. 1 is a cut view of an overmolded pad grid array chip carrier in accordance with the present invention.

Referring to FIG. 1, there is shown a leadless chip carrier 10 in accordance with the present invention. Although shown as an overmolded leadless chip carrier, the chip carrier may take the form of an overmolded pad array carrier, an over molded pin grid array, an overmolded peripheral chip carrier, or alternatively, a glob top pad array carrier, a glob top pin grid array or a glob top peripheral array chip carrier. Examples of overmolded and glob top carriers, also known as BGA or PBGA carriers, are found in the following U.S. Pat. Nos. incorporated herein by reference: 5,241,133; 4,688,152; 5,239,198 and 5,296,738. Essentially, the present invention is applicable to any printed circuit substrate chip carrier incorporating a leadless peripheral interconnect design, and having integrated circuits and an encapsulant such as an overmold or glob top. Typically, a printed circuit board (PCB) for receiving an IC has printed circuitry 18 on the top side of the PCB. In lieu of a typical die mounting area on the substrate top side, the present invention employs a through-cavity opening 22, extending completely through the PCB 14, for die mounting. In the preferred embodiment, the perimeter of the die 12 is in direct and intimate contact with the perimeter of the through-cavity opening 22. However, one can envision a package 30 where the substrate through-cavity opening 23 perimeter is slightly larger than the die 12 perimeter, and the gap between the two perimeters is filled with encapsulant to provide additional mechanical support for the die. Alternatively, one can envision a package 40 where an adhesive material 42 is employed between the perimeter of the die 12 and the through-cavity opening 23, prior to encapsulation, to hold the die in place during wire bonding and encapsulation, and to provide mechanical support of the die in the assembled package.

Figure 2:
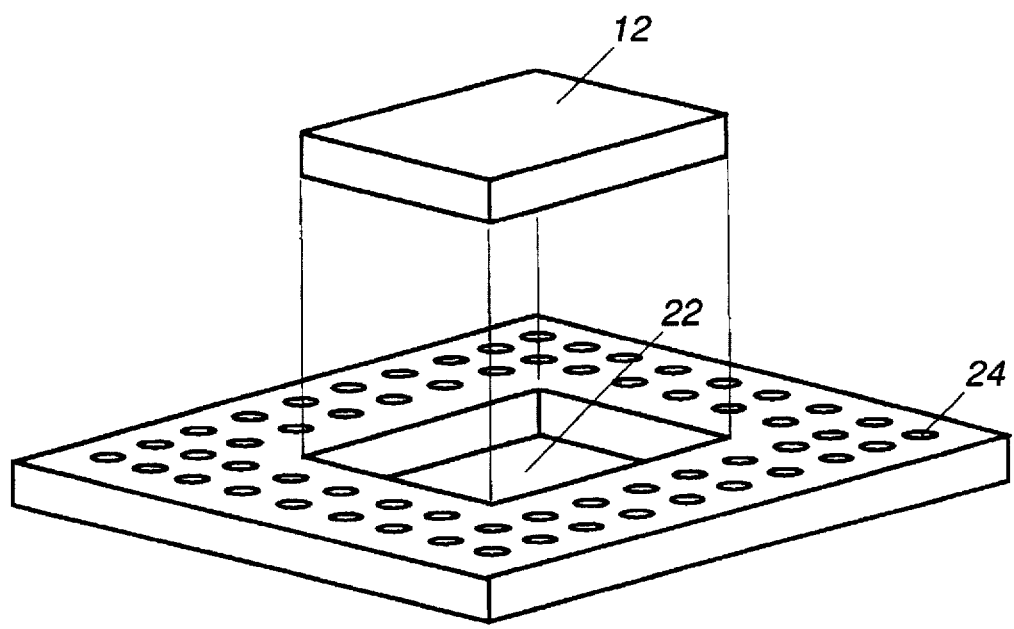
FIG. 2 is an exploded view showing the bottom surfaces of an overmolded pad grid array chip carrier in accordance with the present invention.

The semiconductor die 12 is placed, bottom surface facing down, into the PCB through-cavity opening 22. Contrary to the processes of the prior art, the die is not placed onto a PCB surface and held in place with a die attach adhesive. Instead, the die is held in place by the temporary application of a vacuum which is drawn on the bottom surface of the chip. The die 12 is then wire bonded using conventional wire bonding techniques, as the die is firmly held in place by the vacuum. When wire bonding is complete, the vacuum is removed and the die remains in place by virtue of the wire bonds 26 that have been made between the die 12 and the PCB 14. The die 12 is connected to the surface mount solder pads 24 by means of vias 20 through the printed circuit substrate 14. After wire bonding, a plastic resin such as a glob top or transfer-molded encapsulant 16 is applied over the die 12 and portions of the substrate 14 forming the PBGA chip carrier 10 shown in FIG. 1. In the preferred embodiment, the perimeter portion of the top side of the substrate is not covered by the encapsulating resin. Also, in this embodiment, the bottom side of the PCB substrate is not covered with encapsulant. In some cases, it may be necessary to re-apply a vacuum to the back surface of the die to hold it in place during the encapsulation process. As the encapsulant cures, adhesive bonds are formed at the encapsulant-to-die interfaces, providing mechanical support for the chip. As shown in FIG. 2, a perimeter or peripheral chip carrier typically has surface mount solder pads 24 on the back side of the PCB substrate located in array format, but only in 3 to 4 rows around the perimeter of the package, leaving the center of the package free of solder interconnection sites. Therefore, a through-cavity opening in the center of the package substrate does not affect the pin count of peripheral PBGA packages. As shown in FIG. 2, the PBGA package may be furnished with bare solder pads 24, or as illustrated in FIG. 1, the solder pads may optionally have solder balls or bumps 13.

Figure 3:
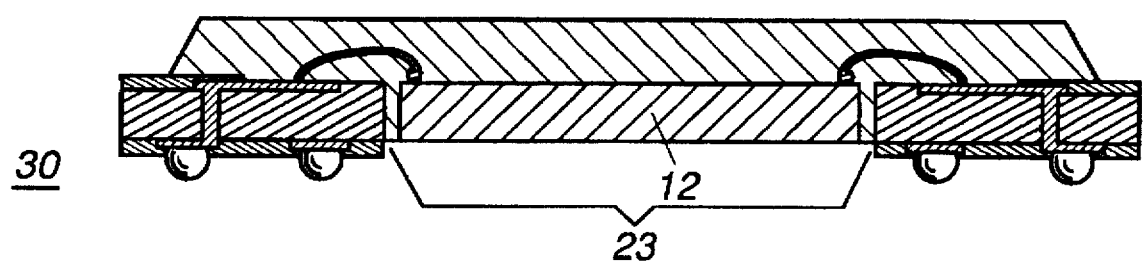
FIG. 3 is a cut view of an overmolded pad grid array chip carrier in accordance with the present invention.

Referring now to FIG. 3, there is shown another cut view of a leadless overmolded peripheral PBGA package in accordance with the present invention. This version of a PBGA carrier 30 has a through-cavity opening 23 perimeter which is slightly larger than the die 12 perimeter. Plastic resin encapsulant 16 fills the void between the die 12 perimeter and the through-cavity opening 23 perimeter. Compressive forces, resulting from slight shrinkage of the encapsulant as it is cooled down to room temperature, are applied against the perimeter of the die, providing additional mechanical support.

Figure 4:
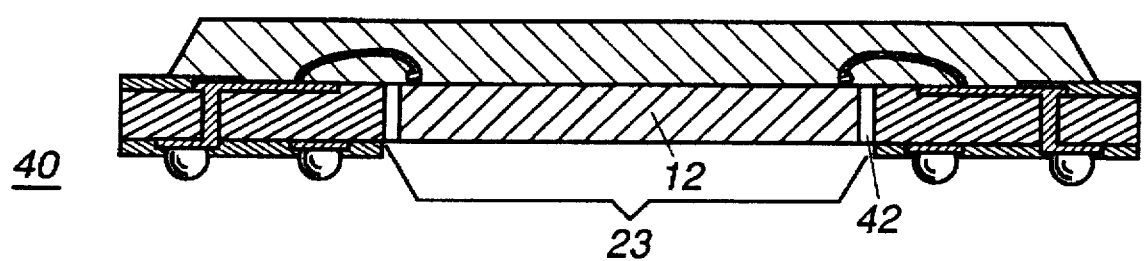
FIG. 4 is a cut view of an overmolded pad grid array chip carrier in accordance with the present invention.

Referring now to FIG. 4, there is shown another cut view of a leadless overmolded peripheral PBGA package in accordance with the present invention. This version of a PBGA carrier 40 also has a through cavity opening 23 perimeter which is slightly larger than the die 12 perimeter. Prior to encapsulation, an adhesive material 42 is applied between the through-cavity opening perimeter and the die perimeter. The adhesive provides support for the chip during wire bonding and encapsulation, and continues to provide mechanical support in the finished package.

In summary, the present invention provides for a novel means of moisture relief for plastic encapsulated peripheral pad chip carriers made from printed circuit substrates. The die is mounted in a through-cavity opening in the substrate, and is held in place by wire bonds and the adhesive strength of the encapsulant at the encapsulant-to-die interface. Depending upon the version of the invention employed, additional mechanical support of the IC is supplied by direct and intimate contact between the IC perimeter and the through-cavity opening perimeter, or alternatively, by an encapsulant or adhesive between the IC perimeter and the through-cavity opening perimeter. By eliminating the die attach region, and thus the hygroscopic die attach material, there is considerably less potential for moisture accumulation within the package. The elimination of the hygroscopic die attach material removes the one component that is most responsible for moisture absorption, thereby providing a package that is more stable in humid environments and that is more amenable to automated assembly. Additional benefits which result from the present invention include: more efficient thermal dissipation from the die and a greatly reduced package height profile.

We claim as our invention:

1. A leadless chip carrier package, comprising:
   a semiconductor die having a top surface, a bottom surface and a perimeter;
   a printed circuit substrate having a through-cavity opening for die mounting, said through-cavity opening extending completely through the printed circuit substrate from a top side to a second opposing bottom side and having a perimeter shape and size approximating the perimeter of the semiconductor die;
   the printed circuit substrate bottom side having a plurality of surface mount solder pads;
   the semiconductor die disposed in the through-cavity opening such that the bottom surface of the semiconductor die is seated below the printed circuit substrate top side the bottom surface exposed through the substrate bottom side; and
   a plastic resin encapsulating a top surface of the semiconductor die and covering portions of the printed circuit substrate top side.

2. The leadless chip carrier package of claim 1, wherein a portion of the printed circuit substrate top side is not covered with the plastic resin.

3. The leadless chip carrier package of claim 1, wherein the plastic resin comprises a glob top encapsulant or a transfer molded encapsulant.

4. The leadless chip carrier package of claim 3, wherein the plurality of surface mount solder pads comprises a peripheral pad grid array.

5. The leadless chip carrier package of claim 3, further comprising solder balls attached to the plurality of surface mount solder pads.

6. The leadless chip carrier package of claim 3, wherein the semiconductor die is held in place by plastic resin disposed between the semiconductor die perimeter and the through-cavity opening perimeter.

7. The leadless chip carrier package of claim 3, wherein the semiconductor die is wire bonded to the printed circuit substrate.

8. The leadless chip carrier package of claim 3, wherein the semiconductor die is disposed in the through-cavity opening such that the semiconductor die bottom surface is substantially coplanar with the printed circuit substrate bottom side.

9. A peripheral pad grid array chip carrier package, comprising:
   an integrated circuit (IC) having a top surface, a bottom surface and a perimeter;
   a printed circuit board (PCB) having a through-cavity opening for IC mounting, said through-cavity opening extending completely through the PCB from a top side to a second opposing bottom side and having a perimeter shape and size approximating the perimeter of the IC;

the PCB bottom side having a plurality of surface mount solder pads arranged as a peripheral pad grid array;

the IC disposed in the through-cavity opening such that the bottom surface of the IC is substantially coplanar with the bottom side of the PCB, the bottom surface exposed through the PCB bottom side, said IC electrically connected to the PCB by at least one wire bond; and a transfer molded plastic resin encapsulating the IC and the at least one wire bond, and covering portions of the PCB top side.

10. The peripheral pad grid array chip carrier package of claim 9, further comprising solder balls attached to the plurality of surface mount solder pads.

11. The peripheral pad grid array chip carrier package of claim 9, wherein the perimeter of the PCB top side is not covered with transfer molded plastic resin.

12. The peripheral pad grid array chip carrier package of claim 9, wherein the IC is held in place by plastic resin disposed between the IC perimeter and the through-cavity opening perimeter.

13. The leadless chip carrier package of claim 9, wherein the IC perimeter is in direct and intimate contact with the through-cavity opening perimeter.

14. A peripheral pad grid array chip carrier package, comprising:

an integrated circuit (IC) having a top surface, a bottom surface and a perimeter;

a printed circuit board (PCB) having a through-cavity opening for IC mounting, said through-cavity opening extending completely through the PCB from a top side to a second opposing bottom side, and having a perimeter shape and size approximating the perimeter of the IC;

the PCB bottom side having a plurality of surface mount solder pads arranged as a peripheral pad grid array;

solder balls attached to the plurality of surface mount solder pads;

the IC disposed in the through-cavity opening such that the bottom surface of the IC is substantially coplanar with the bottom side of the PCB, the bottom surface exposed through the PCB bottom side;

the IC electrically connected to the PCB by at least one wire bond; and a transfer molded plastic resin encapsulating the IC and the at least one wire bond, and covering portions of the PCB top side.

15. A leadless chip carrier package, comprising:

a semiconductor die having a top surface, a bottom surface and a perimeter;

a printed circuit substrate having a through-cavity opening for die mounting, said through-cavity opening extending completely through the printed circuit substrate from a top side to a second opposing bottom side and having a perimeter shape and size approximating the perimeter of the semiconductor die:

the printed circuit substrate bottom side having a plurality of surface mount solder pads;

the semiconductor die disposed in the through-cavity opening such that the bottom surface of the semiconductor die is seated below the printed circuit substrate top side, wherein the semiconductor die perimeter is in direct and intimate contact with the through-cavity opening perimeter; and a plastic resin encapsulating a top surface of the semiconductor die and covering portions of the printed circuit substrate top side, the plastic resin comprising a glob top encapsulant or a transfer molded encapsulant.

* * * * *